United States Patent [19]

Gurgiolo et al.

[11] Patent Number: 4,643,953

[45] Date of Patent: Feb. 17, 1987

[54] ELECTROMAGNETIC SHIELDED BODY

[75] Inventors: Arthur E. Gurgiolo; Marvin E. Winquist, both of Lake Jackson; Thomas M. Knobel, Clute, all of Tex.; Dale C. Teeters, Tulsa, Okla.

[73] Assignee: The Dow Chemical Company, Midland, Mich.

[21] Appl. No.: 846,400

[22] Filed: Mar. 31, 1986

Related U.S. Application Data

[62] Division of Ser. No. 571,286, Jan. 16, 1984.

[51] Int. Cl.$^4$ .............................................. B32B 27/08
[52] U.S. Cl. .................................. 428/520; 428/522; 525/379; 525/337.1; 525/381
[58] Field of Search ................ 252/500; 428/520, 522; 525/379, 331 J, 381

[56] References Cited

U.S. PATENT DOCUMENTS

| | | | |
|---|---|---|---|
| 3,621,085 | 11/1971 | Ichikawa | 264/2 |
| 3,852,223 | 12/1974 | Böhme | |
| 4,317,265 | 3/1982 | Chase et al. | 29/132 |

*Primary Examiner*—Edith Buffalow
*Attorney, Agent, or Firm*—Glwynn R. Baker

[57] ABSTRACT

An electromagnetic shielded body comprising laminating or adhering to the surface of the body or incorporating as an internal lamina of a multiple laminar body a layer of film or powder of an electroconductive material which consists of a dehydrohalogenated haloorganic polymer or copolymeric material prepared by dehydrohalogenating said haloorganic polymeric material in the presence of at least one-half mole of a liquid or solution of an amine per mole of halogen moiety in said polymeric material at from 15° C. to about 205° C. for from about 2 minutes to about 14 days.

16 Claims, No Drawings

ELECTROMAGNETIC SHIELDED BODY

This is a divisional, of application Ser. No. 571,286, filed Jan. 16, 1984.

BACKGROUND OF THE INVENTION

Electromagnetic interference shielding of parts and/or entire assemblies such as computer housings has been primarily obtained by spray coating the surface of such parts or assembly with a metal based coating such as zinc or nickel. These coatings are generally applied after forming or molding of the part or housing. Such spray coating techniques, as well as the compositions per se, do not always provide a continuous unbroken coating. Breaks in the coating result in a break in the continuity of the conductive layer and thus result in poor performance allowing electromagnetic interference to penetrate the housing.

Thus, it would be advantageous to have an electromagnetic interference shielding which has a continuity of the conductive layer each time it is employed.

Further, since the coatings are somewhat brittle they must be applied after shaping or molding or else incontinuity will result at the bends, corners and other forming stress points.

It would be advantageous to be able to apply an electromagnetic interference shielding prior to forming which has the characteristic to be formed, or can be generated on the surface after forming without employing coating techniques. These and other advantages of the present invention will become apparent from the following description and claims.

BRIEF DESCRIPTION OF THE INVENTION

In accordance with the present invention an anti-static and/or electromagnetic interference shielding is obtained by laminating or otherwise adhering to a surface of a block, sheet, film or as an internal lamina of a multi-laminar sheet block or film of moldable polymeric material an electroconductive dehydrohalogenated polymeric film, sheet or block or a dehydrohalogenatable lamina contained on or internal of a laminar film or other structure and thereafter dehydrohalogenating the lamina to provide the electroconductive or anti-static shield. The bonding of such sheet, film or block of dehydrohalogentated or dehydrogenatable polymeric film, block or sheet to the moldable or formable polymeric substrate can be accomplished by temperature annealing, adhesive or other bonding technique.

Use of the present invention can be made in any shaping, molding or forming operation wherein electromagnetic interference or anti-static shielding, static barrier or collector or electrode coating is needed. The versatility of the present invention permits sheet molded polymer laminate technology to be used to mold cabinets for computer or business machines as well as antistatic laminate films for packaging electronic parts.

In addition, the use of a laminar film, sheet or block of a dehydrohalogenatable material as an interior or exterior layer of a moldable polymeric sheet, film or block permits the shaping of the part such as a cabinet and thereafter treatment in accordance with the teachings of application Ser. No. 528,818 filed Sept. 2, 1983, which is incorporated herein in it entirety, to obtain an exterior continuous electroconductvie surface.

In accordance with the present invention a polymer or copolymer having some shape or body such as powders, pellets, granules, film, fiber, sheet or more complex shaped as well as laminates which have the dehydrohalogenatable film or body accessable to the dehydrogenating agent (e.g. halogenated polymer or copolymer such as polyvinyl chloride (PVC) or poly(vinylvinylidene chloride)) can be dehydrohalogenated in the presence of at least one-half mole of an amine at 15° to 250° C., optionally in the presence of a solvent, for from about two minutes to 14 days to produce electroconductive resins. It is to be understood that the dehydrohalogenated or dehydrohalogenatable polymer can be laminated to a sheet, fiber, film or complex in a stable shape by thermal-pressure adhesion, adhesive techniques and/or reactive attachment. Thus, a laminate of, for example, polyethylene and PVC can be made and the PVC dehydrohalogenated in place either as an exterior of interior layer.

The electroconductivity of these electroconductive resins can be increased by treatment with a Lewis acid, a halogen or an alkali metal as well as by increasing the amount of nitrogen substituted on the backbone, again either as an exterior or interior layer.

Suitable polymers are halogenated polymers and copolymers such as, for example, chlorinated polyethylene, chlorinated acrylates and methacrylates, chlorinated paraffins, chlorinated polyacrylonitrile, chlorinated polyacrylic acid and methacrylic acid, chlorinated polystyrene, chlorinated vinyl esters, chlorinated vinyl ethers, as well as mixtures of such polymers and copolymers thereof with vinylidene chloride, acrylonitrile, styrene, vinyl ethers, ethylene, acrylic acid, acrylates, methacrylates; vinyl esters and the like, polyvinyl chloride polymers and copolymers with vinylidine chloride, acrylonitrile, styrene, vinyl ethers, ethylene, acrylic acid, acrylates, methacrylates, vinyl esters, polyvinylidine chloride, polyvinylidine chloride copolymers, polyvinylidene fluoride and copolymers.

Suitable amines that can be used to dehydrohalogenate the halogenated polymers and copolymers above described are the aliphatic primary, secondary and tertiary amines, having aliphatic moieties of from 1 to 8 or more carbon atoms as well as the higher polyalkylene polyamines of like alkylene carbon chain lengths, e.g. polyalkylene polyamines of molecular weights of, for example, 250. It is, of course, to be understood that the secondary and tertiary amines may contain different carbon chain length moieties. Further, mixtures of one or more amines from the above classes of amines may be employed. In addition, one may use alone, mixtures of two or more, or mixtures with the aforedescribed aliphatic amines of aromatic and cyclic amines as well as aromatic substituted aliphatic amines. Some of such amines representative of the numerous classes are methyl through octadecyl amine, dimethyl-, methylethyl- and the like, through dioctadecyl amines, trimethyl through trioctadecyl amines, aniline, diphenylamine, triphenylamine, benzyl amine, aromatic-aliphatic substituted amines, methyl aniline, dimethyl aniline, diamines and triamines, e.g. ethylene diamine, diethylene triamine (DETA), triethylene tetramine (TETA), tripropylene diamine, etc., substituted amines, ethanolamine, diethanol amine, triethanolamine, substituted aromatic amines, chloroaniline, methoxy anilines, toluidines, aromatic diamines and triamines, benzene diamines, toluene diamines, methylene dianiline. Where the amines are solids, it is desirable to use solvents to aid the physical work up of the products. However, solvents may be and preferably are employed with all amines.

Suitable solvents which both extend the dehydrohalogenating agent and aid in the penetration of lamina encasing the dehydrohalogenatable film are: alcohols-methanol through octyldecyl alcohol; aromatics-benezene, toluene, xylenes, chlorinated aromatics, methoxybenzenes, phenols, ethyl benzene, dialkyl benzenes, ethers-dialkylethers, cycloethers (such as tetrahydrofuran), DOWANOL* (*trademark of The Dow Chemical Company) such as methoxyethanol, ethoxyethanol, etc. Esters may be used with tertiary amines, but not with primary and secondary amines; hydrocarbons-butanes through kerosene, etc. cycloaliphatic hydrocarbons. It is desirable to use solvents that can be removed easily from the products.

Amount-at least an equivalent of active amine nitrogen is desired per equivalent of halogen desired to be removed from the polymer. For almost complete removal of halogen from a polymer an excess of amine (about 0.2 mole excess over stoichiometry) is desirable to ensure halogen removal. A large excess may be used (a 2 molar ratio of amine to halogen or more) if it is desired to use the amine as a carrier or diluent for the reaction.

Dopants-treatment of the polymeric or resinous materials prepared in accordance with the present invention with Lewis acids, halogens or alkali metals (liquid, solvent solutions and/or vapors) improves the electroconductivity of the materials. Lewis acids such as HCl, HI, HF, HBr, $H_2SO_4$, $F_3C(SO_2)OH$; halogens such as $I_2$, $Br_2$, $Cl_2$ and alkali metals such as Na and K are particularly useful. The amounts, times of treatment and temperature of treatment can be varied depending on whether only surface treatment is desired, a short time; or depth penetration is desired, a long time; or a short time high temperature (up to 250° C.). When the dehydrohalogenated film is an inner lamina it may be necessary to conduct the doping in the presence of a swelling agent for the outer lamina, e.g. tetrahydrofuran. Much of the technology employed in the prior art can be employed in treating the materials of the present invention with improvement in conductivity substantially commensurate with those teachings.

Temperature Range −15° C.–250° C., preferred range 25°–120° C. Temperature is varied according to the ease of dehydrohalogenation of the halogenated polymer as well as the thermal stability of the other lamina constituents. Thus, for PVC polymers the preferred temperature range is 60°–120° C.; SARAN* (*trademark of The Dow Chemical Company) polymers, 25°–60° C., initially, followed by higher temperatures if desired; chlorinated polyethylene, 100° C.–120° C.

As stated, suitable temperatures range from about 15° C. to about 250° C. are preferably from about 25° C. to about 120° C.

The dehydrohalogenation is time-temperature-amine dehydrohalogenation agent activity related as well as to the ease of halogen removal. Some wide variation in time is to be expected. Results have shown time from eight minutes to eight hours are normally sufficient to dehydrohalogenate at least the surface of the polymer or copolymer to produce a reasonably commerically acceptable electroconductivity. However, times from two minutes to 14 days may be required if the dehydrohalogenation agent is fast or slow at the temperature selected or if the polymer or copolymer is slow to react. Further, when the halogenated film is an inner layer of a laminate, additional time may be required to obtain effective or desired electroconductive properties.

Pressure is not critical, atmospheric or superatmospheric pressure being employable. Superatmospheric pressure may be advantageous in causing the dehydrohalogenation of thick shapes to more rapidly dehydrohalogenate to greater depths.

It is, of course, to be understood that unhalogenated polymers and copolymers as external lamina may be halogenated then dehydrohalogenated to obtain similar results.

The novel compounds obtained by treating halogenated polymers or resins in powder, sheet, film block, laminates, or more complex shapes, in accordance with the aforedescribed dehydrohalogenating techniques are, for example, when a vinyl chloride or vinlyvinyledene chloride polymer is dehydrohalogenated analytically defined as polymers having empirical formulae (it being understood that the exemplified ethylenic results are randomly as well as consecutively distributed throughout the structure):

if partially dehydrohalogenated:

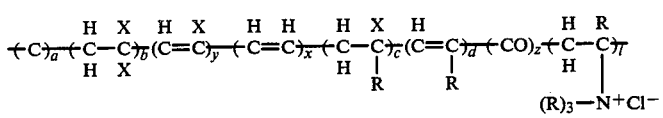

(In the presence of air or oxygen some oxygen is found in the analysis including oxygen in the carbonyl form (=CO), however, if under an oxygen free atmosphere, then no (=CO) appears although pure carbonization seems to still occur as in the totally dehydrohalogenated post heated case below.)

if totally dehydrohalogenated and post heat treated:

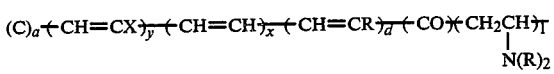

wherein x represents an integer from 5 to 50; b, c, d and y each represent an independently selected integer from 0 to about 3x; z represents an integer from 0 to about x; a represents an integer of from 0 to about 35; and each R represents an organic moiety independently selected from the group hydrogen, alkyl, aryl, alkaryl, —CN, —C(O)OR moieties of up to 10 carbon atoms, and X represents hydrogen or halogen.

One technique for preparing the novel compounds is by treating halogenated polymers or resins as powders, films, sheets, blocks, or the like in accordance with the aforedescribed process thereby resulting dehydrohalogenation and in the substitution of the nitrogen dehydrohalogenation agent onto random carbon atoms of the backbone. The exact nature of the substitutions and whether the nitrogen substitutent is quaternized is not known, but the addition of from about 0.1 to 20 percent by weight nitrogen onto the backbone improves electroconductivity. The elemental analysis shows that nitrogen is a component and tests indicate increasing amounts of nitrogen improve the electroconductivity

DETAILED DESCRIPTION OF THE INVENTION

Preparation of electromagnetic interference shielding films

A 6"×6" piece of SARAN WRAP* (*trademark of The Dow Chemical Company) film was put in a Pyrex tray in a dry box under nitrogen. The film was covered with diethylenetriamine (DETA) and the tray gently tilted to and fro to aid in the dehydrochlorination reaction. Almost at once the film turned pale yellow which rapidly became deeper yellow and finally a golden yellow brown. Using forceps, the film was turned over in the solution to ensure that both sides were exposed evenly. The color progressively became light brown, dark brown, and finally a deep black color. It was of a metallic irridescent black color. The film retained its shape and integrity, and possessed quite good mechanical strength although it could be torn with the fingers. After about 20 minutes, the film was removed from the tray, and transferred to another tray containing alcohol, also in the dry box under nitrogen. The film was thoroughly washed; the wash alcohol drained from the tray and fresh alcohol was added. This was repeated again. The film was now blotted dry and allowed to dry in a $N_2$ purge stream for 30 minutes. The specific resistance was now measured without removing it from the dry box. The specific resistance was $10^8$ ohm-cm of 1 mil thickness. The treated sheet was laid flat on a sheet of polyethylene film and a ¼" thick mold cut from silicon rubber gasket material was positioned to the film. When epoxy resin containing 8 pph DETA as a curing agent was poured into the mold, a 4"×5"×¼" block resulted with the dehydrochlorinated SARAN film laminated tightly to the bottom side. Excess film was trimmed from the edges and the sample was tested for antistatic dissipation on commerical equipment.

Test conditions: 74° F., 14% relative humidity (sample conditioned for 24 hours)

Test equipment: Electro-Tech Systems 406B

Test method: A 5000 volt charge (+ and −) was applied to sample. The sample was grounded and the charge decay time to 50 volts was recorded (less than 2 seconds is the accepted industry specification).

Results:

| Sample Test No. | Dissipation (sec.) (+5000 volts) | | | Dissipation (sec.) (−5000 volts) | | |
| --- | --- | --- | --- | --- | --- | --- |
|  | 1 | 2 | 3 | 1 | 2 | 3 |
| Epoxy/SARAN laminate (control) | >40 | >40 | >40 | >40 | >40 | >40 |
| Epoxy/De HCl SARAN | 0.07 | 0.07 | 0.08 | 0.08 | 0.08 | 0.08 |

In an exemplification of the present invention a 4"×4" square of SARANEX* (*trademark of The Dow Chemical Company) 3 mil thick (a layer of SARAN between two layers of polyethylene manufactured by The Dow Chemical Company) was immersed in diethylene triamine (DETA) in a Petri dish for 30 minutes. The film became light yellow and with the film still in the DETA it was heated for 30 minutes at 70° C. The film became a dark reddish brown black color showing dehydrohalogenation has occurred. The film was washed in methanol and dried. The film was flexible with no apparent change in strength characteristics from untreated film. The film was anti-static and electroconductive.

In a manner similar to the foregoing example a 4"×4" square of SARANEX was immersed in a 20% by volume of tetrahydrofuran in DETA for 30 minutes, whereupon the film became a deep yellow color. The dish, solution and film was warmed at 50° C. for 30 minutes whereupon the film became deep black in color. The film was washed with methanol and blotted dry. The solution employed in this example appeared to penetrate the film more rapidly and thereby resulted in a more rapid dehydrohalogenation of the SARAN inner layer as evidenced by the deep yellow color and the deep black color of the film after 30 minutes in the solvent and after 30 minutes heating in 50° C., respectively. The film was still strong and flexible and exhibited electroconductive properties.

Such films as above prepared can be used to wrap electromagnetic tapes to maintain the tapes free of damage due to static build-up in containers used for storage and/or shipment.

We claim:

1. An electromagnetic shielded body comprising incorporating as an internal lamina of a multiple laminar body a layer of film or powder of an electroconductive material which consists of a dehydrohalogenated haloorganic polymer or copolymeric material prepared by dehydrohalogenating said haloorganic polymeric material in the presence of at least one-half mole of a liquid or solution of an amine per mole of halogen moiety in said polymeric material at from 15° C. to about 250° C. for from about 2 minutes to about 14 days.

2. The electromagnetic shielded body of claim 1 wherein said organic polymeric materials are prepared by conducting a halogen-containing polymeric material with a liquid or vapor containing an amine for at least 2 minutes at from about 15° C. to about 250° C. to at least partially dehydrohalogenate the polymeric material.

3. The electromagnetic shield material of claim 2 wherein an additional step of treating said dehydrohalogenated polymeric material with a Lewis acid, a halogen or a metal alkali is carried out following dehydrohalogenation.

4. The electromagnetic shielded body of claim 1 wherein the amine is an aliphatic amine having one to eighteen carbon atoms in each aliphatic moiety, and each aliphatic moiety, if more than 1, is selected independent of the other.

5. The electromagnetic shielded body of claim 1 wherein the amine is an aromatic amine.

6. The electromagnetic shielded body of claim 1 wherein the polymeric material is polyvinylchloride.

7. The electromagnetic shielded body of claim 1 wherein said amine is triethylamine.

8. The electromagnetic shielded body of claim 1 said amine is triethanolamine.

9. The electromagnetic shielded body of claim 1 wherein said amine is morpholine.

10. The electromagnetic shielded body of claim 1 wherein the polymer is a copolymer of vinylchloride and vinylidene chloride.

11. The electromagnetic shielded body of claim 1 wherein said amine is diethylenetriamine.

12. The electromagnetic shielded body of claim 1 wherein said amine is triethylamine.

13. The electromagnetic shielded body of claim 1 wherein the polymer is poly(vinylidene chloride).

14. The electromagnetic shielded body of claim 1 wherein the polymer is a copolymer of vinylidene chloride and another vinyl monomer selected from the group consisting of methyl acrylate, acrylonitrile, ethylacrylate, and vinylidene chloride.

15. The product of claim 1 wherein the electromagnetic shield is produced by the method of claim 1 wherein the polymeric material is polyvinyl chloride, and the amine is triethylamine and the temperature of treatment is 140° C. for 48 hours, the product washed with water, then alcohol, then dried followed by heating to 170° C. to initiate an exotherm to 220° C. and held thereat until no vapors of HCl are detected.

16. The product of claim 1 wherein the electromagnetic shield is produced by the method of claim 1 wherein the polymeric material is polyvinyl chloride, and the amine is triethylamine and the temperature of treatment is 140° C. for 48 hours, the product washed with water, then alcohol, then dried.

* * * * *